United States Patent
Yeh

(10) Patent No.: US 8,482,057 B2
(45) Date of Patent: Jul. 9, 2013

(54) CIRCUIT AND METHOD FOR A THREE DIMENSIONAL NON-VOLATILE MEMORY

(75) Inventor: Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/428,754

(22) Filed: Mar. 23, 2012

(65) Prior Publication Data
US 2012/0235224 A1   Sep. 20, 2012

Related U.S. Application Data

(62) Division of application No. 11/804,608, filed on May 18, 2007, now abandoned.

(51) Int. Cl.
*H01L 29/792* (2006.01)

(52) U.S. Cl.
USPC .................. 257/324; 257/315; 257/E29.309

(58) Field of Classification Search
USPC ............. 257/314, 315, 324, E29.3, E29.309; 365/185.17, 185.18
See application file for complete search history.

(56) References Cited

U.S. PATENT DOCUMENTS

| | | | |
|---|---|---|---|
| 6,172,907 B1 | 1/2001 | Jenne | |
| 6,774,433 B2 * | 8/2004 | Lee et al. | 257/326 |
| 2002/0017659 A1 | 2/2002 | Hashimoto et al. | |
| 2002/0160586 A1 * | 10/2002 | Wada et al. | 438/509 |
| 2004/0251487 A1 | 12/2004 | Wu et al. | |
| 2005/0124120 A1 * | 6/2005 | Du et al. | 438/283 |
| 2006/0237706 A1 * | 10/2006 | Enda et al. | 257/1 |
| 2007/0165455 A1 * | 7/2007 | Park et al. | 365/185.01 |

OTHER PUBLICATIONS

Jung, S-M., et al., "Three Dimensionally Stacked NAND Flash Memory Technology Using Stacking Single Crystal Si Layers on ILD and TANOS Structure for Beyond 30nm Node," 2006, IEEE, 4 pages.

The Depletion Mode MOSFET; http://web.archive.org/web/20050406102700/http://www.play-hookey.com/semiconductors/depletion_mode_mosfet.html; 2 pages.

* cited by examiner

*Primary Examiner* — Tucker Wright
(74) *Attorney, Agent, or Firm* — Slater & Matsil, L.L.P.

(57) ABSTRACT

An architecture, circuit and method for providing a very dense, producible, non volatile FLASH memory with SONOS cells. SONOS memory cells are formed using a uniformly doped channel region. A FinFET embodiment cell is disclosed. Because the novel SONOS cells do not rely on diffused regions, the cells may be formed into a three dimensional array of cells without diffusion problems. FLASH memory arrays are formed by forming layers of NAND Flash cells in the local interconnect layers of an integrated circuit, with the metal layers forming the global bit line conductors. The three dimensional non-volatile arrays formed of the SONOS cells rely on conventional semiconductor processing. P-channel and n-channel devices may be used to form the SONOS non-volatile cells.

19 Claims, 11 Drawing Sheets

CIRCUIT AND METHOD FOR A THREE DIMENSIONAL NON-VOLATILE MEMORY

This application is a divisional of U.S. patent application Ser. No. 11/804,608, entitled "Circuit and Method for a Three Dimensional Non-Volatile Memory," filed on May 18, 2007, which application is incorporated herein by reference.

TECHNICAL FIELD

The present invention relates to a circuit and method for providing a three dimensional non-volatile memory cell using charge trapping storage in a silicon oxide nitride-oxide ONO silicon (SONOS) flash memory device. The cell incorporates a uniform doping for the source, drain and channel regions. In one preferred embodiment a FinFET form is used, and in another preferred embodiment a fully-depleted silicon on insulator (FD-SOI) form is used. The cell utilizes a charge trapping transistor using ONO or other similar dielectrics. A plurality of these non-volatile memory cells may be arranged in three dimensions using vertical layers. Processing methods are presented for fabricating integrated circuits incorporating memory portions using the SONOS cells. These cells are particularly useful to increase the density of a Flash NAND memory array because the uniform doping in the source, drain and channel circumvents thermal source and drain out diffusion problems that occurred in prior art attempts to form three dimensional arrays where SONOS cells are used.

BACKGROUND

Non-volatile memory cells are used to store data in integrated circuits. As portable and battery powered devices become increasingly important in the consumer products industry, the need for permanent data storage when batteries lose power or between uses of a battery powered product, increases. Examples of consumer products that require non-volatile storage are battery operated devices such as cell phones, portable computers such as laptops, notebooks and PDAs, wireless email terminals, MP3 audio and video players, portable wireless web browsers and the like, and these integrated circuits increasingly include on-board data storage. As is known in the art.

A commercially important type of non-volatile storage is the NAND flash array. These arrays offer good storage density and permanent data storage, however the erase and program cycles are performed to address several cells at once. Another type of non-volatile storage is NOR Flash, which is more suitable when random access to individual cells is required, NOR flash cells are arranged with individual bit and word lines accessing individual cells, however the density of these arrays is lower and so the amount of data storage/unit area is also much lower. Both types of non-volatile memory are becoming increasingly prevalent in various applications for storage of data, voice, images, audio and video.

FIG. 1 depicts a type of non-volatile charge trapping storage cell. In FIG. 1, a semiconductor substrate region 11 is shown in a cross sectional view. Source and drain regions 15 and 25 are formed using conventional semiconductor process doping steps to dope the substrate followed by an anneal step to cause thermal diffusion to form the source and drain diffusions to the desired depth. A dielectric stack, typically oxide nitride oxide or so-called "ONO", is formed from deposition and patterning steps as are known in the art. Oxide 23, nitride 13, and oxide 19 are deposited or grown over the substrate. Polysilicon gate 17 is formed to complete the storage cell, this gate is the control gate and will be used to receive the word line or row line voltage. This planar non-volatile cell, a single gate non-volatile device, can be programmed by adjusting the threshold voltage so that the cell is either conducting, or non-conducting, in the presence of a read voltage on the control gate. By assigning a logical value of 1 or 0 to the state of conducting, or non-conducting, the cell may be programmed to store a data value. The program state involves trapping charge at the nitride, which acts to make the cell conductive or non conductive in subsequent read cycles. This programming step is reversible so that the storage cell may be programmed for many thousands of cycles.

As one approach to forming useful densities of the non-volatile cell of FIG. 1, a stacked arrangement using silicon on insulator or SOI layers as the vertically stacked "substrate regions" could be used. FIG. 1 depicts the effect of repeated thermal processes on the planar silicon ONO silicon, or SONOS, non-volatile cell in the dashed area. For example, in a typical stacking arrangement, the first layer of cells could be formed on the silicon substrate, with subsequent layers of cells being formed on SOI layers built up vertically. To manufacture this structure, each additional source drain region annealing step performed at each layer would subject the lower, already completed cells, to additional thermal processes. In FIG. 1, the undesired additional thermal diffusion of the source and drain regions is shown, if this undesired diffusion continues over many process steps the two regions may even electrically contact and close the channel region between them, causing device failure. Even if such a failure does not occur, the source and drain diffusion changes the channel length, and affects the operation of the device after it is completed, resulting in unpredictable threshold voltages (Vt) and other deleterious effects.

A need thus exists for improved SONOS non-volatile storage cells, methods for manufacturing the cells, and circuitry and methods that substantially maintain the advantages of the SONOS non-volatile cells and the layout efficiency and compactness of the prior art cell approaches, while offering an efficient solution to the thermal diffusion problems associated with the known three dimensional cell arrays of the prior art.

SUMMARY OF THE INVENTION

These and other problems are generally solved or circumvented, and technical advantages are generally achieved, by embodiments of the present invention, which provide circuits and methods of manufacture for forming an improved SONOS non-volatile storage cell, three dimensional circuit arrays, and semiconductor processes for use in an integrated circuit. The improved circuit and methods solve the thermal diffusion problems associated with repeated thermal cycles used to form three dimensional arrays of SONOS storage cells.

In one preferred embodiment, a SONOS storage cell is provided as a triple gate or FinFET cell formed of intersection polysilicon regions, the source drain and channel are formed in a first doped polysilicon region, and a FinFET gate structure is formed by depositing and patterning an ONO dielectric and a triple gate over the source drain poly using, for example, a second perpendicular or similarly oriented polysilicon gate structure. Because the doped polysilicon of the source drain region is uniformly doped when formed, and there are not separate source drain diffusion regions, no thermal diffusion occurs during subsequent processing and the thermal budget for the semiconductor processes can be relaxed as compared to three dimensional SONOS cell structures of the prior art.

In another preferred embodiment, a SONOS cell is provided as a patterned FD-SOI structure that is uniformly doped to provide the source drain and channel region, and a polysilicon gate structure is formed overlying an ONO dielectric layer. The SONOS storage cell is provided as a uniformly doped region in an SOI layer of silicon over the interlevel dielectric layers, because there are not separate source drain diffusion regions, the cell is not adversely affected by undesirable diffusion as subsequent layers are processed.

Three dimensional memory arrays are provided in additional preferred embodiments of the invention. Layers of SONOS cells are provided with word lines, and bit line are coupled vertically through the layers using select circuits. As is known in the non-volatile storage cell art, cycles of programming, erasure, and read are used to store data into the cells and to retrieve data from the cells. The three dimensional array may include many layers of cells to provide a very dense and compact non-volatile memory array.

In another preferred embodiment, the non-volatile storage array may be provided as a core of memory cells that is integrated with logic or processor circuitry to provide an application specific integrated circuit (ASIC) or system on a chip (SOC) that is highly integrated. These highly integrated circuits may reduce the component count required to implement important electronic systems functions such as cell phone circuitry, PDAs, laptop or portable computers, music and video players, and the like.

In another preferred embodiment a discrete memory integrated circuit is provided using the three dimensional arrays of SONOS cells.

Additional embodiments of NAND Flash circuitry using the SONOS cells in a three dimensional array are provided. Control circuitry and vertical and horizontal conductors are formed to implement a Flash memory array using the SONOS cells in a vertical arrangement.

Preferred methods of manufacturing the cells are disclosed. In a preferred method using the FinFET SONOS cells, polysilicon regions of source, drain, and channel material are formed in a first direction, and uniformly doped. Dielectric layers forming an ONO dielectric are arranged over the polysilicon and forming the triple gate dielectric by lying over the top and the sides of the polysilicon channel region. Polysilicon gate regions are formed overlying the dielectric and laying over the top and adjacent the sides of the channel region to form the triple gate structure. In an alternate preferred method, regions of uniformly doped SOI material are formed and isolated electrically using shallow trench isolation techniques. ONO dielectric regions are formed above the SOI to define channel regions for each SONOS cell, and a gate polysilicon is formed over the dielectric, subsequent layers of SOI material are formed vertically using semiconductor processing steps. Multiple layers may be added to vertically increase the number of cells without requiring additional planar area on the integrated circuit. Highly integrated non-volatile arrays are therefore practical using the storage cells of the invention.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
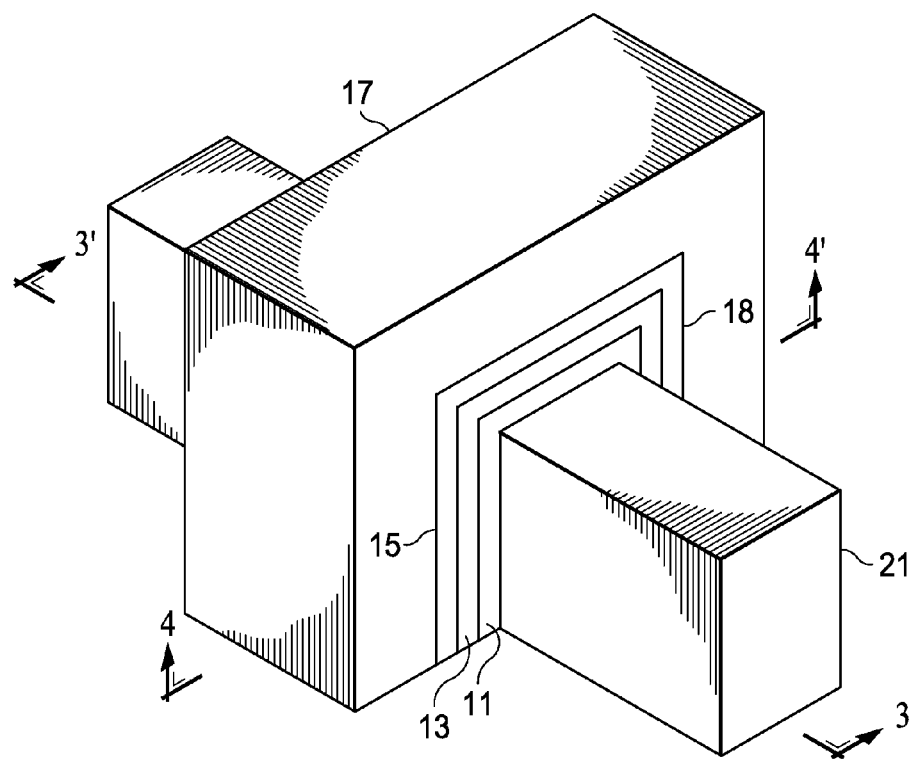
FIG. 2 illustrates a simplified three dimensional diagram of a portion of a SONOS non volatile memory cell using a FinFET or triple gate transistor.

FIG. 2 depicts in a simple three dimensional view a preferred embodiment of the non-volatile memory cell of the invention. In the preferred embodiment of FIG. 2, the cell is implemented using a FinFET or triple gate MOS transistor approach. A silicon layer 21, typically an epitaxially grown or otherwise deposited polysilicon, is formed and uniformly doped. Alternatives to the polysilicon include bulk silicon, which is doped. The doping is preferentially performed as the polysilicon is deposited or grown, e.g. in situ and in a preferred embodiment, the doping is uniform. A charge-trapping dielectric region is formed over the silicon region, in a preferred ONO embodiment the first layer 15 is an oxide, the second layer 13 is a nitride, and the top layer 11 is also an oxide. Alternatives known to those skilled in the art may also be used, for example a simple ON or NO layer may be used, the top oxide may be omitted, or the dielectric may be quite complex, that is multiple materials of high-k dielectrics, oxide stack layers, SiC, SiON, SiCON and the like may be used to form the charge trapping dielectric layer. Section 3-3' is illustrated in FIG. 3 as a cross section, section 4-4' is illustrated in FIG. 4 as a cross section.

Gate electrode 17 is then formed over the dielectric and the silicon layer. The gate electrode is then patterned, so that silicon layer 21 provides a source, drain, and channel regions, with the region covered by the gate electrode forming a transistor gate. The gate electrode can be formed of polysilicon in one preferred embodiment, alternatives include n-doped or p-doped polysilicon or a metal gate; again these alternatives are known to those skilled in the art.

Figure 1:
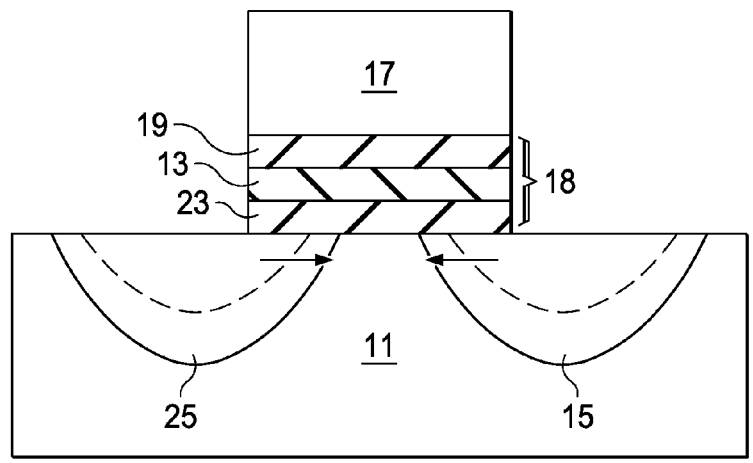
FIG. 1 illustrates a planar SONOS non-volatile memory cell of the prior art.

The FinFET SONOS cell of FIG. 2 has several advantages over the planar SONOS cell of the prior art. By increasing the channel width of the device (without greatly increasing the two dimensional area of the device) the storage electron number for each cell is increased. Because the source and drain are uniformly doped with the channel material, and diffusion doping is not used, the compatibility of this device with complex three dimensional processes is much greater than the conventional planar SONOS cell of FIG. 1, that is a greater thermal budget is available for subsequent semiconductor process steps, over the prior art approach. This advantageously enables the manufacture of vertical arrays of cells to form highly integrated memory devices, although single layer devices are also contemplated as part of this invention. The SONOS cell of FIG. 2 is also very compatible with SOC or ASIC processes that incorporate many other types and sizes of transistors to form a highly integrated ASIC device.

Figure 3:
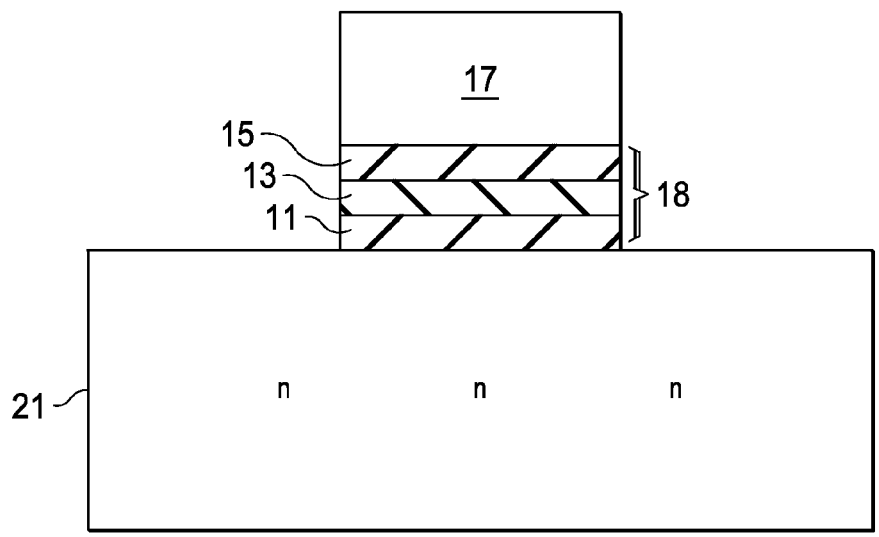
FIG. 3 illustrates in a first cross section the non volatile FinFET device of FIG. 2.
Figure 4:
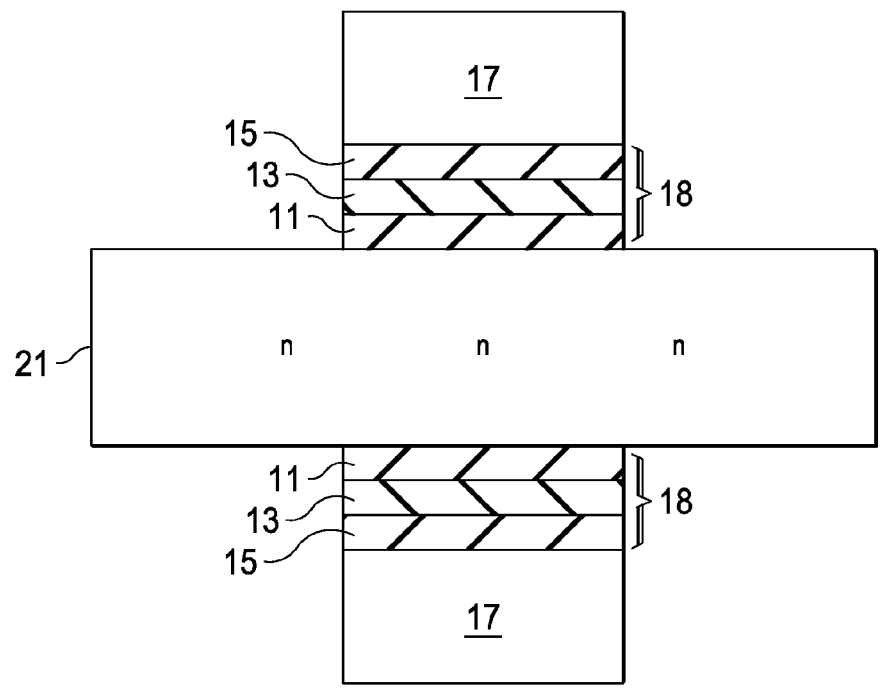
FIG. 4 illustrates in a second cross section of the non volatile FinFET device of FIG. 2.

FIG. 3 provides a cross sectional view of the memory cell device of FIG. 2 taken along the section labeled 3-3' in FIG. 2. The uniform doping of the silicon region 21 is shown as "n"-type, however p-type doping is also contemplated and is part of the present invention, the device shown in FIGS. 2, 3, 4 and others is merely exemplary. The charge trapping dielectric layer is again depicted as an oxide 11, nitride 13, and a top oxide 15, again the top oxide is optional and alternative, more complex dielectric stacks may be used so long as they provide charge trapping layers. Gate electrode 17 is seen above the ONO layer 18 in this cross section, however it extends over and adjacent two sides of the silicon region 21 which accordingly forms the channel, source, drain and gate regions of the device of FIG. 2.

FIG. 4 is a second cross sectional view of the device of FIG. 2 taken along the section 4-4' in FIG. 2.

Figure 5:
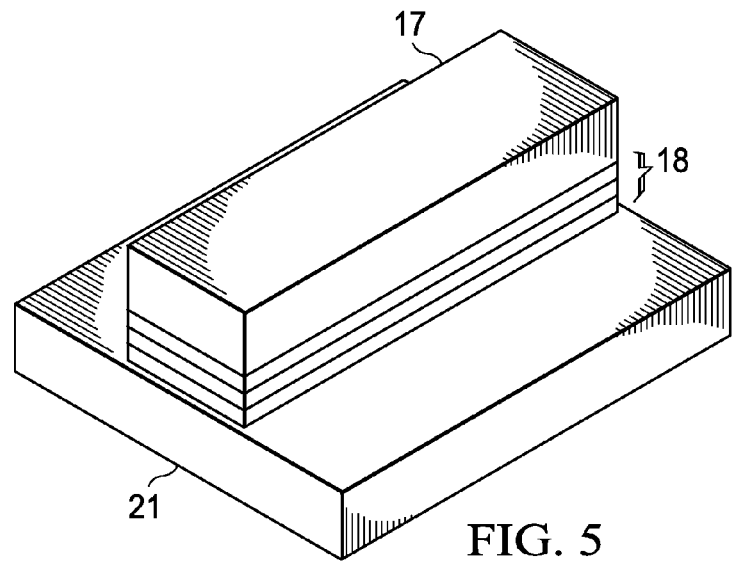
FIG. 5 illustrates in a simplified three dimensional drawing a planar, fully depleted SOI ("FD-SOI") preferred embodiment of a SONOS non volatile memory cell.

FIG. 5 depicts another preferred embodiment of a SONOS non-volatile cell using uniform doping of the silicon layer. In FIG. 5 a simplified three dimensional view is depicted having a silicon layer 21, a charge trapping layer 18, and a gate electrode 17. Again the charge trapping layer 18 is preferably comprised of an oxide, nitride, oxide (ONO) layer, however as is known to those skilled in the art, the top oxide layer may be omitted for example to form an ON layer; an NO layer may be also be used. Various complex dielectric stacks incorporating high-k dielectric materials may be used so long as the completed structure is a charge trapping layer. Again the silicon may be formed, in a preferred embodiment, from doped polysilicon that is deposited or grown and the doping is uniform, typically the silicon layer 21 will be doped in situ. The silicon layer 21 may also be formed from bulk silicon, doped or undoped, III-V materials, as well as polysilicon. Because the structure in FIG. 5 may be formed as a silicon layer 21 over an insulator, it is considered in some embodiments an "SOI" or silicon over insulator structure. The important feature is again that the channel, source and drain regions are uniformly doped, so that the device of FIG. 5 provides a broad thermal budget for subsequent process steps, in contrast to the planar SONOS cell of FIG. 1 with the thermally diffused source and drain implants. Because the devices fabricated in this uniform doping manner are depletion mode devices, the device may be considered a fully depleted SOI (FD-SOI) device.

Figure 6A:
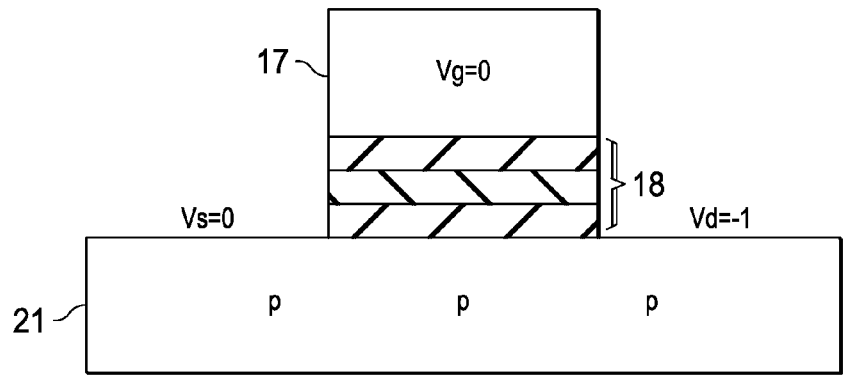
FIG. 6A illustrates a first cross section of a P-channel cell of FIG. 5.

FIG. 6A depicts a simple cross sectional view of the device of FIG. 5. In FIG. 6A the FD-SOI SONOS cell is shown with a "p" doping in the channel 21. The gate electrode 17 forms the device over the uniformly doped region, with one side of the gate (symmetric device, so source and drain are physically interchangeable) being the source terminal for the single gate non volatile memory cell, the other being the drain terminal. The ONO layers that make up the charge trapping layer 18 provide a means for storing charge to program and erase the non volatile cell by changing the threshold of the device, so that when a nominal read voltage is placed on the gate electrode 17, the device either conducts, or does not conduct, current that may be easily sensed. Current flowing in the device can be "hole" or "electron" current, in either case the device can be assigned a "programmed" or "erase" state and thus store a logical '1' or a logical '0' for an indefinite period of time, thereby providing permanent data storage. Note that for a single cell, source and drain are interchangeable since the source and drain regions are symmetric. In the memory string with series memory cells, source and drain of a cell are not interchangeable since one side of the cells in the string are connected to a bit line and the other side of the cells in the string is connected to common source line.

Figure 6B:
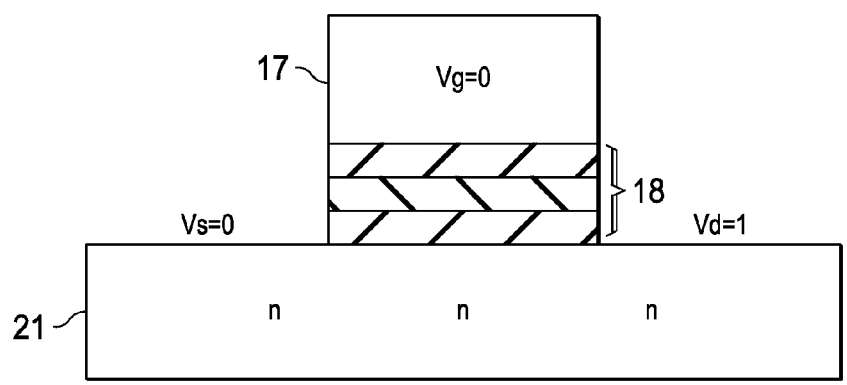
FIG. 6B illustrates a second cross section of an N-channel cell of FIG. 5.

FIG. 6B depicts in a cross section the device of FIG. 5 wherein the uniformly doped channel region is an "n"-type doping. Again the gate electrode, fabricated in a self-aligned manner to the charge trapping ONO dielectric 18, overlies the doped silicon or polysilicon 21 and thus forms the gate for the non volatile memory device, while one side of the gate electrode is the source terminal and the other opposite side becomes the drain terminal. The text in FIGS. 6A and 6B designates the voltages Vs (source voltage), Vd (drain voltage), and Vg (gate voltage) for a typical "read" operation.

Figures 6C, 7:
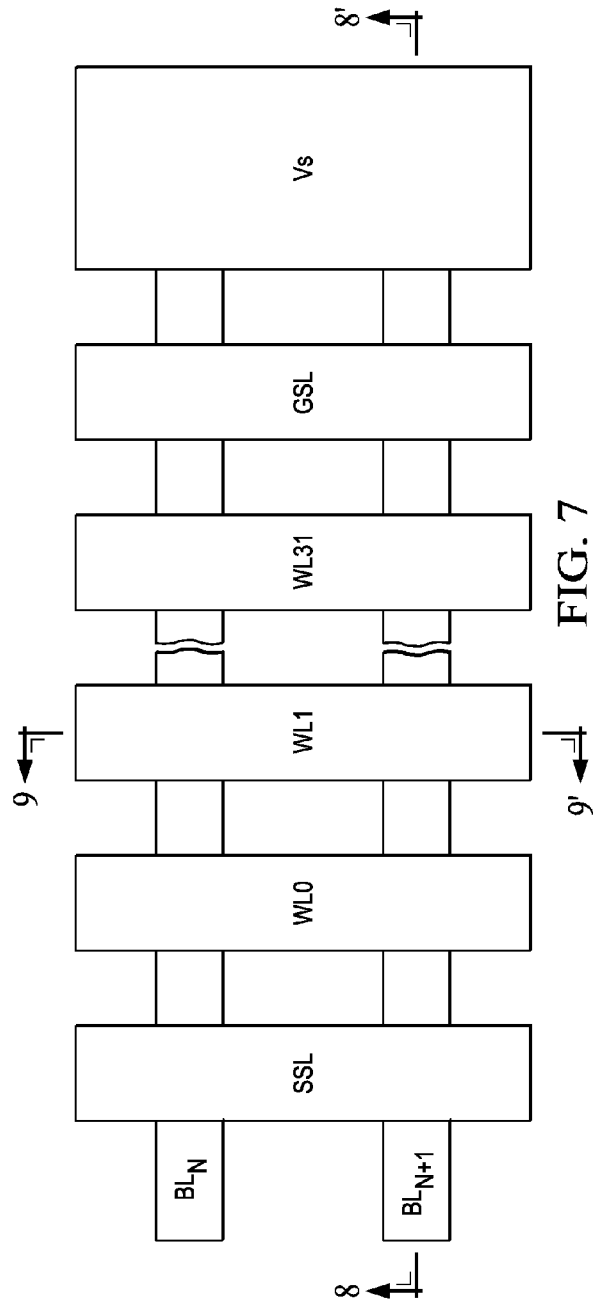
FIG. 6C is a table indicating operations of the cells of FIGS. 6A and 6B.
FIG. 7 illustrates a plan view of a portion of a memory array implemented using the FinFET embodiment of the SONOS non-volatile memory cells.

FIG. 6C is a table indicating the voltages applied to the gate, drain and source terminals for the p-channel and n-channel SONOS devices of FIGS. 6A and B respectively. The operations that are performed are Erase, Program and Read (one skilled in the art will recognize that for these devices, Erase and Program may be interchanged by simply changing the definition of an erased cell and a programmed cell. The mechanisms for erasure and programmation are also provided in FIG. 6C, for the p-channel device the erase is performed by injection of electrons in to the gate, and for programming the mechanism is hole injection from the channel into the charge trapping layer. In a corresponding manner, for the N-channel SONOS device the mechanism for the erase is channel electron injection, and the program is by gate hole injection.

FIG. 7 depicts, in a top down or plan view, a portion of a layout for implementing a memory array using one of the SONOS cells of the invention, either the FinFET embodiment (slightly preferred) or the FD-SOI embodiment may be used with the structure of FIG. 7. In FIG. 7, a pair of local bit line conductors $BL_N$ and $BL_{N-1}$ are shown running in parallel from left to right. These conductors may be polysilicon, preferably in situ doped polysilicon as described above, or other silicon material formed into parallel conductors. The intersecting lines are control lines and word lines for implementing a subarray portion of a memory device, for example the line labeled SSL is a source selection line that will provide a selection control line to a MOS transistor formed at the intersection of the SSL line and the bit line inputs. When the source selection line is active, the MOS transistor formed at that intersection of the SSL line and the local bit lines will couple the local bit lines $BL_N$ and $BL_{N+1}$ to bit lines running through the array. Similarly MOS transistors formed at the intersection of the control line labeled GSL and the local bit lines will, when the correct voltage is applied, couple the ground voltage or Vs to the bit lines. Thus the subarray of memory cells may be selectively made active by the control lines and, at other times, left inactive. In this manner many cells may be arranged together to form arrays of memory cells.

In FIG. 7, SONOS cells of one of the preferred types described above are provided at each intersection of a word line WL, which in this exemplary array are provided as 32 lines (more or less could be used) enumerated 0 to 31. At each intersection of a gate electrode, the word lines, with the local bit lines (BL lines) a non volatile storage cell is formed. The vertical electrodes labeled SSL, WL and GSL are typically formed from polysilicon conductors running in parallel to each other and arranged in a direction orthogonal to, or at some other angle to, the bit lines BL. Thus the intersection points of FIG. 7 depict two columns of 32 cells, or 64 cells total. In a practical array many thousands of such cells will be provided.

The word lines are typically considered to be rows, and the bit lines the columns, of an array. For each column that is active (as selected by providing the SSL control line to couple the local bit line to a global bit line, not shown) and coupled to the correct voltage (GSL control line couples the local bit line to the reference potential) the word lines must select one of the cells, here one of 32, because the data is transmitted on a common bit line for each column. These operations are well known to those skilled in the memory art.

Figure 8:
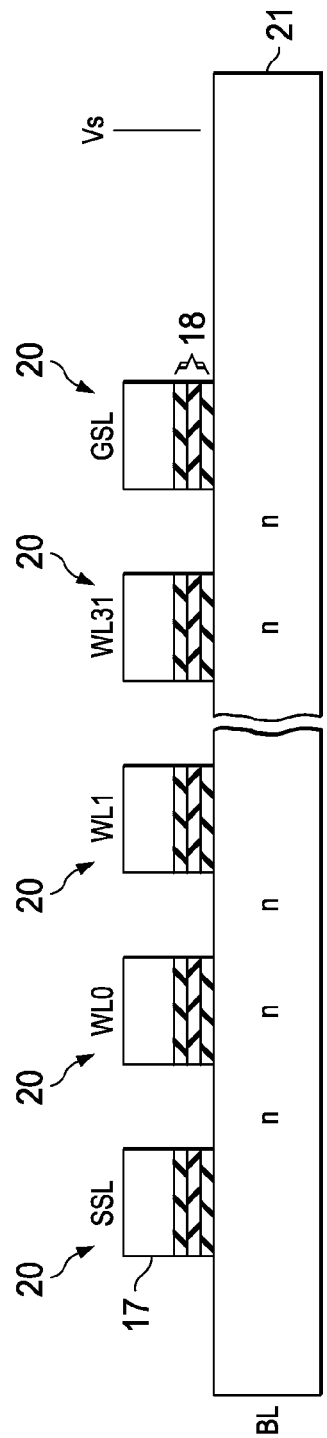
FIG. 8 depicts a first cross sectional view of the memory array portion of FIG. 7.

A simplified cross sectional view of the section 8-8' of the structure in FIG. 7 is depicted in FIG. 8. In the column of devices shown along the silicon region 21, isolation regions are required between each active device 20, but for simplicity these isolation regions are not shown. STI or shallow trench isolation could be used, for example, to electrically isolate the devices along the silicon region 21. As can be seen from the illustration, the gate electrode labeled SSL can be used to couple the local bit line 21 to another bit line, when the column is not active the local bit line 21 will be electrically isolated. Similarly the gate electrode labeled GSL can be used to couple the local bit line 21 to the Vs or ground potential, when the gate electrode GSL does not have a proper potential placed on it, the local bit line 21 will not be coupled to a ground voltage.

One skilled in the art will recognize that to couple one of the active devices 20 to the bit line input/output node BL, the devices between a selected one of the devices 20 have to act as pass through transistor devices. In other words, in this embodiment a NAND architecture is used, so that while one of the non volatile memory devices 20 is active for a read, for example, the other transistors are used to pass the signals from the selected cell to the bit line node, or to couple the drain of the selected cell to the voltage Vs. This operation will be explained in further detail below, but a NAND architecture, and the operation of such an architecture, for FLASH non volatile memory devices is known to those skilled in the art.

Figure 9:
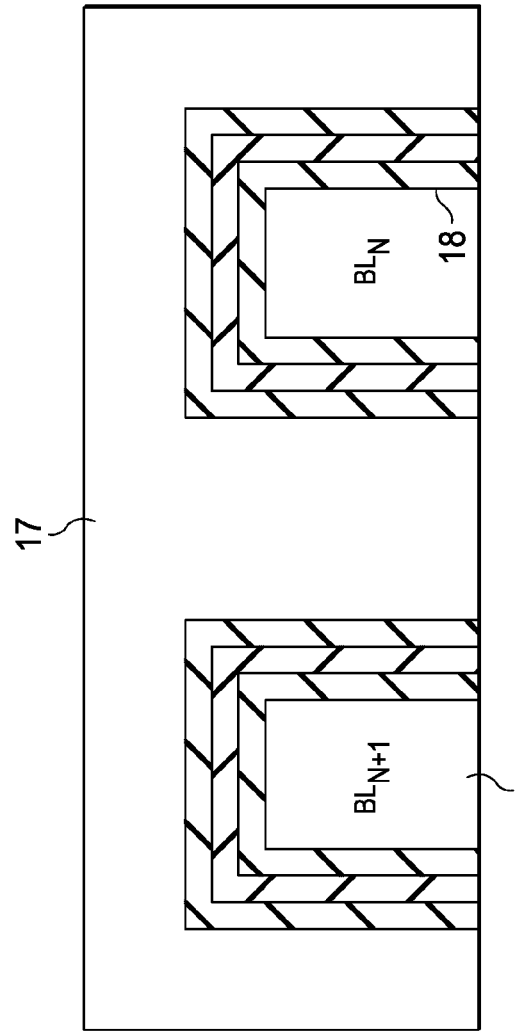
FIG. 9 depicts a second cross sectional view of the memory array portion of FIG. 7.

FIG. 9 depicts a cross section taken along section 9-9' of the plan view of the memory array structure depicted in FIG. 7. In FIG. 9 the silicon, polysilicon or epitaxial silicon bit lines $BL_N$, $BL_{N+1}$ are depicted. In this exemplary embodiment the FinFET structure is used to implement the non volatile cells, so that the charge trapping ONO layers 18 are shown over three sides of the bit line, and the gate electrode 17 which is coupled to a word line WL (not shown) overlies both the three sides of the charge trapping layer 18 and extends, in this view over both of the bit lines BL. In operation, when a potential corresponding to a read voltage is placed on the word line, the cells 20 will either conduct current, or not conduct current, depending on whether they are "programmed" or "erased" as shown in Table 6C. The flow of current is observed and the stored data is determined from that condition.

Those skilled in the art will recognize that by providing a uniformly doped source, drain and channel region in the devices of FIGS. 2 and 5 above, the devices are "fully depleted." In other words, unlike an enhancement mode device whereby a potential placed on the gate forms a channel in a counter doped channel region thereby coupling a normally isolated source and drain regions, these devices operate in depletion mode. When a negative potential (relative to the source and drain potentials) is placed on the gate, a normally open channel can be depleted or closed. Thus the program, read and erase operations of these SONOS cells will be different from the prior art cell operations based on "enhancement" mode devices.

As is known to those skilled in the art, for a non-volatile memory cell to work as a storage location for example in a FLASH application, the cell has to have a threshold voltage that is changed between an "erased" state and a "programmed" state so that when a "read" voltage is placed on the gate terminal of the device, current either does (greater than the threshold) or does not (less than the threshold) flow. The cells can be used in FLASH or EEPROM applications, the difference between the two being in how the erase and program steps are performed, in a FLASH device the cells are erased and programmed in groups or subarrays simultaneously, this is sometimes called FLASH NAND architecture. In a NOR architecture individual cells or groups of cells can be accessed. Different applications make different architectures more or less desirable; NOR is typically used for permanent code storage for example, while NAND is typically used for data storage such as for cameras, cell phones, music players and the like.

In FIG. 6, two SONOS cells are depicted. FIG. 6A depicts in cross section a p-channel depletion mode (uniformly doped channel) SONOS device, and FIG. 6B depicts in cross section an n-channel depletion mode (uniformly doped channel) SONOS device. FIG. 6C presents a table showing, for a particular dielectric and channel structure, the voltages applied in an exemplary embodiment to program, erase and read the cells. For example, the p-channel device is programmed using hole injection, this is observed to occur when the gate voltage is placed at a potential of −10 Volts, the source and drain voltages are at zero. In this mode holes are injected into the charge trapping layer and change the threshold voltage (from an initial "erased" state). To return the cell to its erased state, the p-channel device requires a gate voltage of −14 Volts, again the source and drain terminals are placed at zero volts. This causes electrons to travel into the charge trapping layer and thus the device threshold is returned to its initial, or erased, state. A read is executed for the p-channel device by placing a 0 Volts potential on the gate electrode, and 0 Volts potential on the source electrode, and a −1 Volts potential on the drain electrode, thus if the device is programmed, hole current will flow while if the particular device is erased, no hole current will flow. Note that by reversing the definitions of "programmed" and "erased," the voltages for "programming" and "erasure" may be exchanged. The key point is that the cell has two states, one in which a detectable current flows, and one in which the current does not flow, and that the states may be returned by simple manipulation of the source, drain and gate voltages in a repeatable fashion thousands or millions of times.

As shown in FIG. 6C, the n-channel SONOS device also may be programmed and erased but the potentials used are different. For example, for erasure the gate potential is increased to 14 Volts, and the source and drain terminals are maintained at 0 Volts. In this condition channel electrons are drawn to the charge trapping layer. To program the n-channel device, a 10 Volt potential is placed onto the gate and the source and drain terminals are placed at a 0 Volts potential. In this condition hole carriers are injected from the gate into the charge trapping layer thus changing the potential from the "erased" state. A read is performed by placing a 0 Volts potential on the gate and source terminal while a voltage of 1 Volt (in this particular example) is placed on the drain, and electron current is detected to determine the state of the SONOS cell is either erased or programmed. Those skilled in the art will recognize that a logical value of '1' or '0' is assigned to the programmed and erased state, enabling the cell to store binary data as is known in the art.

The numbers 3/7/6 (nm) in the table denotes the bottom-oxide/nitride/top-oxide thickness of the preferred ONO thickness for device operation in certain embodiments. The thickness of nitride is designed to provide sufficient nitride traps for carrier storage. The bottom and top oxide thickness are designed for isolation during cell retention and carrier injection during program/erase operation. First, the bottom and top oxide must be substantially thick to prevent carriers from escaping from the nitride during the cell data retention period. Second, the thickness of bottom oxide and top oxide are also designed to control the hole and electron injection. Since oxide (e.g. $S_iO_2$) shows higher barrier for holes (~4.7 eV) than electrons (~3.2 eV), the bottom oxide thickness is thinner for hole injection from the substrate and thicker for electron injection from the gate. Inversely, if the hole injection is performed from the gate, a thinner top oxide thickness is preferred.

FIG. 7 depicts, in a simplified top view, a portion of a single level memory array implemented using the SONOS non volatile memory cells. Either type of the preferred cells may be used and a non volatile cell is formed at the intersection of any of the word lines WL0 . . . WL31 as shown in FIG. 7, and either column or bit line $BL_N$ or $BL_{N+1}$. There are additional transistors formed at the intersections of the source select line SSL, which is a gate electrode, and the bit lines, and the GSL line which is a gate electrode, and the bit lines. To operate the memory array of FIG. 7, the SSL line couples the local bit lines to a global bit line, the GSL line couples the bitlines to a ground potential, one of the word lines WL selects a row that is active by placing a program, erase, or read potential on that word line, and the remaining word lines WL are placed in a potential that allows the devices on either side of the selected non-volatile cell (at the intersection of the active word line WL and the bit line BL) to pass signals to and from the bit lines BL. Thus all of the devices formed at the intersections of the word lines WL and the bit lines BL play a role in each memory cycle, but for a read cycle only one device is active while the others "pass through" the signals (ground on one side, and coupling the select lines through the SSL transistor to the global bit lines). This operation is a characteristic of the NAND architecture as explained in more detail below.

FIG. 8 depicts the single level memory array portion of FIG. 7 in a first cross sectional view along section 8-8'. In FIG. 8, the non volatile devices are shown formed with the uniformly doped bit line silicon, or polysilicon 21, as the channel. Each cell has a source and drain region (not shown in detail) formed in the silicon channel on either side of the gate electrodes. The storage cells are formed where the word lines WL0 . . . WL31 intersect with and overlie the silicon channel 21. At each intersection a charge trapping 18 is formed to complete the single gate cells. For the devices formed at the SSL and GSL gate electrode intersections with the silicon channel 21, typically the threshold will not be changed from the initial state, that is, it is anticipated that these devices will never be "programmed." In that case, these devices are simple depletion mode transistors and they will coupled the silicon channel 21 to a voltage reference Vs on one end, and to the global bit lines (not visible) on the other end. One of the word lines WL is active in a read cycle, and the selected device will be coupled to the global bit line BL on one end, and to the voltage reference Vs on the other end, by operating the remaining devices formed beneath the other word lines WL as pass through or pass gate transistors.

FIG. 9 depicts a cross section taken along section 9-9' of the single level memory array in FIG. 7. In FIG. 9, the silicon region 21 is depicted for the two bit lines (although many more would be present in a practical array, two were selected for illustration only); each has a charge trapping ONO dielectric 18 overlying the bit line on three sides (for this FinFET example) and each is then further covered by the gate electrode material 17 which will be coupled to one of the word lines WL0 . . . WL32.

Figure 10:
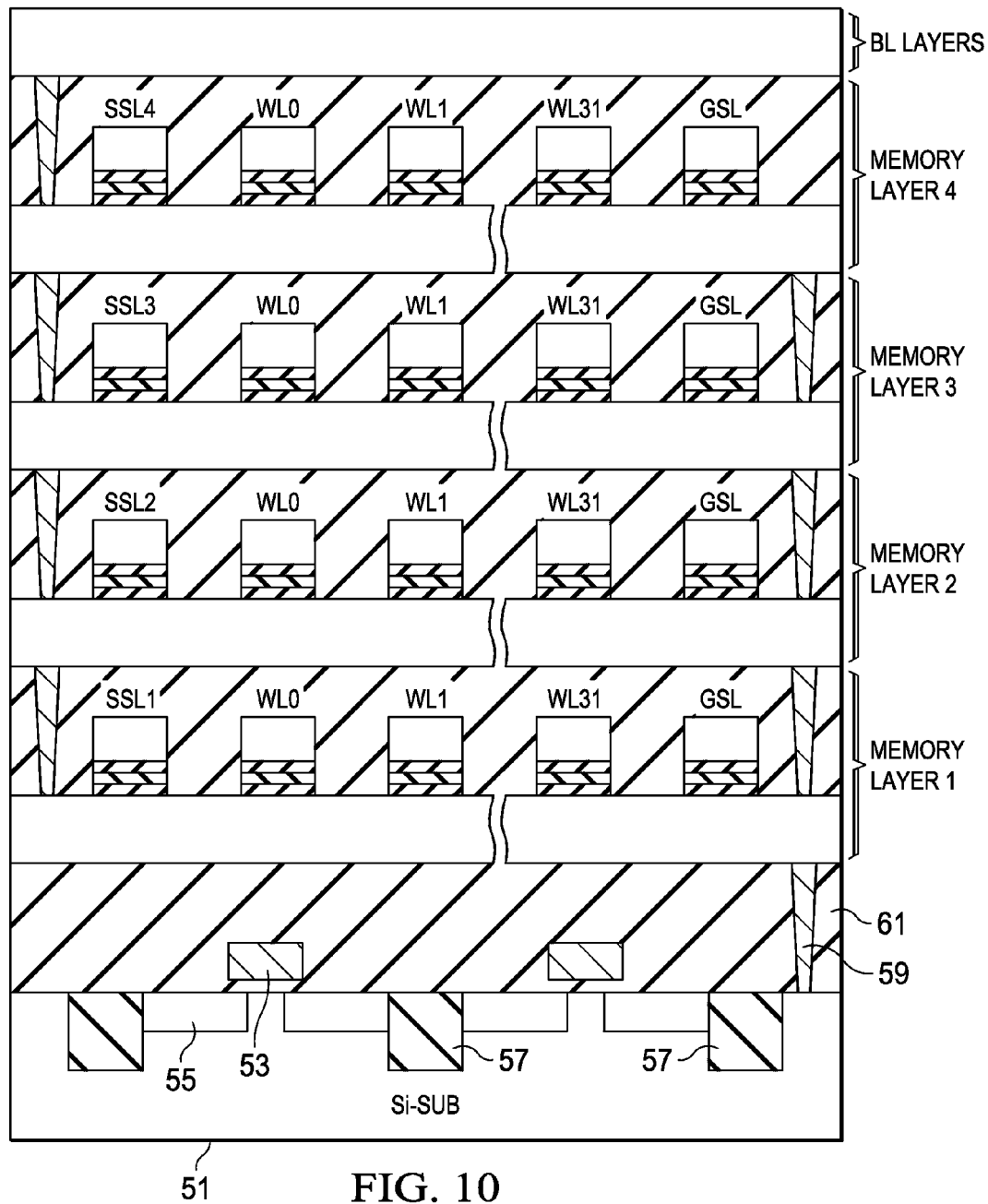
FIG. 10 depicts a cross sectional view of a preferred embodiment of a three dimensional memory array incorporating the invention, the three dimensional array implemented using the SONOS non-volatile memory cells to form multiple layers of memory arrays coupled together.

FIG. 10 depicts a cross sectional view of a multiple layer (memory layer 4, 3, 2, 1) vertically stacked array of nonvolatile memory cells using the SONOS cells from FIG. 4, for example. Each memory layer 1, 2, 3, 4 of FIG. 10 is implemented similarly to the single level embodiment of FIGS. 7, 8 and 9. In FIG. 10, a semiconductor substrate such as a silicon substrate 51 is provided. Isolation regions 57, here depicted as shallow trench isolation or STI regions, are formed. Between the isolation regions, transistors such as high voltage MOS transistors may be provided, using known n-well and p-well processes, these may provide CMOS devices. Source and drain regions 55 may be formed and gate electrodes 53 are provided over typical gate dielectrics to complete these high voltage transistors. These transistors are required, for example to provide the high voltage program (14 volts) and erase (10 volts) voltages needed to operate the non-volatile memory cells. Interlevel dielectric material, which may be a simple oxide, or nitride, or which may include stacks of dielectrics including the high-k materials of the art, layers of materials such as SiON, SiCON, oxides, nitrides, tantalum oxides and the like may be used to form the interlevel dielectrics. Vias 61 are formed to provide an electrical path from the layers formed above the substrate to a contact region on the substrate, although only one via is shown from the memory layer 1 to the substrate, many more may be provided. Memory layer 1 is then formed from a polysilicon or epitaxial silicon layer as described above, and as described above, self aligned gate dielectrics including charge trapping layers and gate electrodes are formed above and overlying the silicon layer so that at every intersection of a silicon line and a word line WL, a memory cell is provided as shown in FIGS.

7, 8 and 9. Ground select transistors GSL and source select transistors SSL1 are formed to provide the control circuits for the cells arranged along memory layer 1 in FIG. 10. The structure repeats in a vertical direction to form a vertically stacked, or three dimensional, memory array. Again dielectric material is provided over memory layer 1 and separating it vertically from memory layer 2, vias are formed to couple the memory layer electrically to circuits arranged vertically above it, and the vias are used to distribute, for example, the Vs potential to each layer, or to couple each layer to a global bit line.

In FIG. 10 this three dimensional array of cells is shown having 4 memory layers, more or less layers could be provided in any given example. In integrating the memory cell array with other circuitry, it would be most preferred to use the local interconnect layers, usually formed from polysilicon, as the memory layers in FIG. 10 and to use the metal layers, usually formed from copper, aluminum, single or dual damascene metallization, or aluminum copper alloys, to form the bit line or BL layers. As each memory layer is formed, charge trapping dielectric layers and gate electrodes are formed and using conventional SC processes, are self aligned to one another. Isolation regions are used to isolate each cell from the adjacent memory cells, for simplicity these are not illustrated here but may be, for example, shallow trench isolation or STI regions.

After the top memory layer, 4 in the example illustrated in FIG. 10, is completed, a corresponding interlevel dielectric layer is formed over it, and a via is formed to couple the memory layer to one or more bit line layers. When the array of FIG. 10 is integrated in an ASIC or SOC with other circuitry, it would be preferred to use one or more of the metal layers to form the global bit lines, labeled BL. Of course the bit lines could be polysilicon or SOI, but in a preferred embodiment they would be formed from the metal layer conductors.

Figure 11:
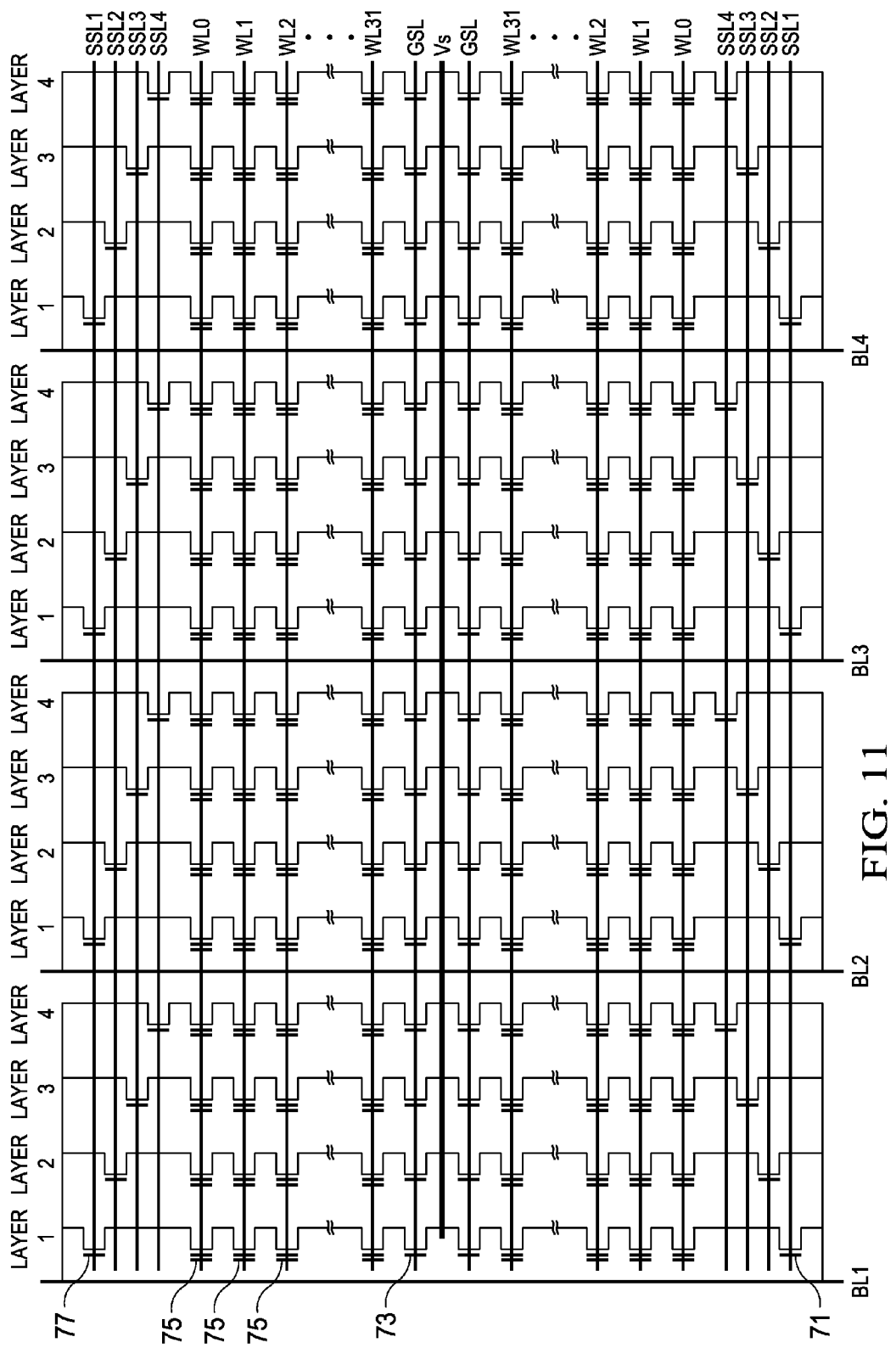
FIG. 11 illustrates a schematic view of a preferred embodiment circuit diagram of the memory array incorporating the SONOS non-volatile memory cells of the invention.

FIG. 11 presents a circuit schematic diagram for a portion of a memory array formed using the SONOS non volatile memory cells of the present invention. Either the FD-SOI or FinFET embodiment cells may be used, with each having a uniformly doped channel without thermal diffusion regions. The bit lines labeled BL1, BL2, BL3, and BL4 are depicted traversing two banks or subarrays of memory cells, an upper bank and a lower bank. These banks are arranged on either side of a voltage potential conductor labeled Vs. The control transistors 73 coupled at their gate electrodes to the control line labeled GSL are used selectively to enable the upper or lower portions of the memory array. The source select transistors 71 coupled to control lines SSL1, SSL2, SSL3, SSL4 are used for each bit line to select one of the layers Layer 1, Layer 2, Layer 3, Layer 4 to couple to the bit lines BL. The word lines WL0 ... WL31, which are provided in two sets, one for the upper portion and one for the lower portion, are used to select a particular non volatile memory cell 75 for each layer. The replicator dots in the figure and the hash marks in the columns of FIG. 11 indicate that although not every word line WL is depicted, there are in this example 32 rows in each of the upper and lower portions and 32 word lines. The cells in the Figure represent an array of 32 cells×4 layers×2 arrays (upper and lower) for a total of 256 cells for each bit line BL1, 2, 3, 4. Because the arrays are layered in the vertical direction, the density in a two dimensional or area measurement for silicon area used is much higher than a single layer array.

For a read cycle each bit line BL1, 2, 3, 4 is coupled to one memory cell 75, this is accomplished using the word lines WL to select an active row, the source select lines SL1, 2, 3, 4 to choose an active layer from the memory layers 1, 2, 3, 4, and the GSL lines to select an active bank or portion (upper or lower) of the array to couple to the voltage potential. As described above, the cells that are arranged on either side of the active cell along the layers must be placed in a "pass through" mode to couple the drain side of the active non volatile SONOS memory cell to the voltage potential Vs and the source side of the cell to the source select transistor 77, which further couples the data to the bit lines BL.

Figure 12:
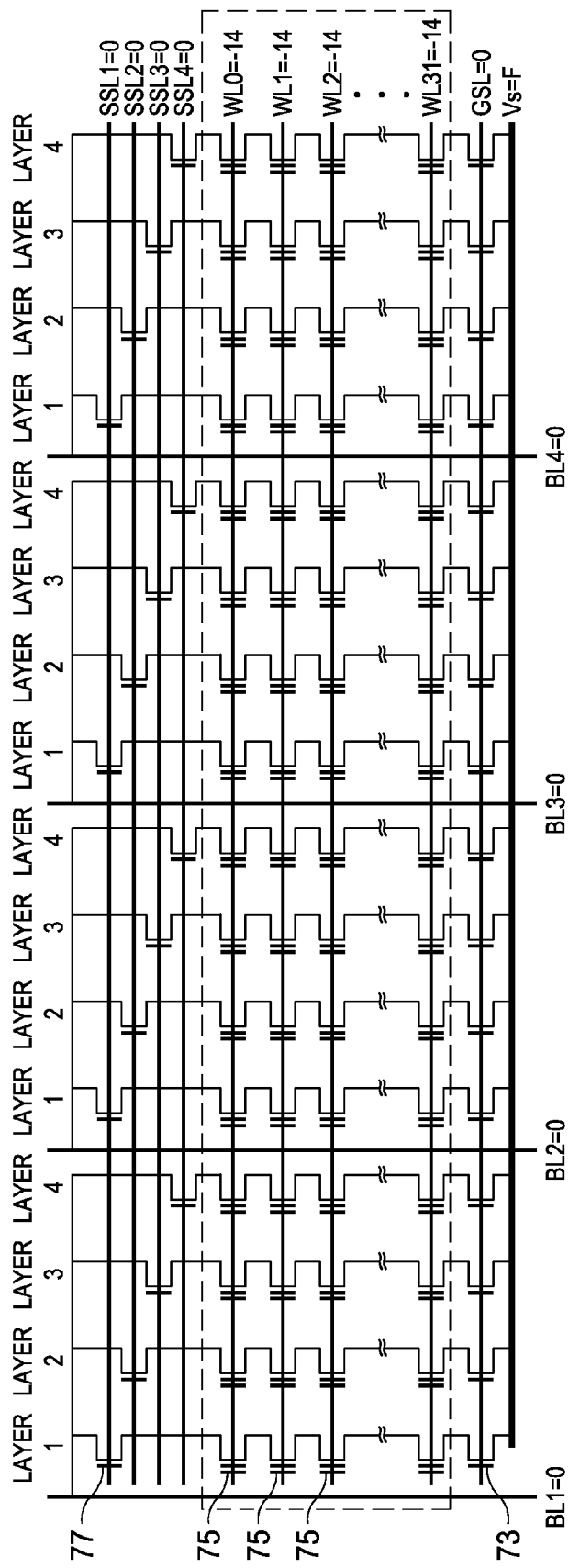
FIG. 12 illustrates the circuit diagram of FIG. 11 and depicts an exemplary ERASE operation.

FIG. 12 depicts the upper portion, for example, of an array as depicted in FIG. 11, for an erase operation. In the erase operation, which is a so-called "FLASH" erase, every non-volatile memory cell is simultaneously affected. As shown in FIG. 12, the cells may be implemented using a p-channel type device. In the p-channel erase operation, the gate electrode for each cell (coupled to word lines WL0 ... WL31) are taken to the erase potential of −14 Volts. The source select lines are left at a "0" potential, as is the gate select control line GSL, so that the voltage potential Vs is a "don't care" as the nodes are not coupled to Vs. The mechanism for the erase is gate electron injection, that is, electrons are injected into the charge trapping ONO layers from the gate. After erasure the cells are all left at a logical '1' value. Subsequent program operations will be used to change those cells that should be at a logical '0' value for data that is stored in the array.

Figure 13:
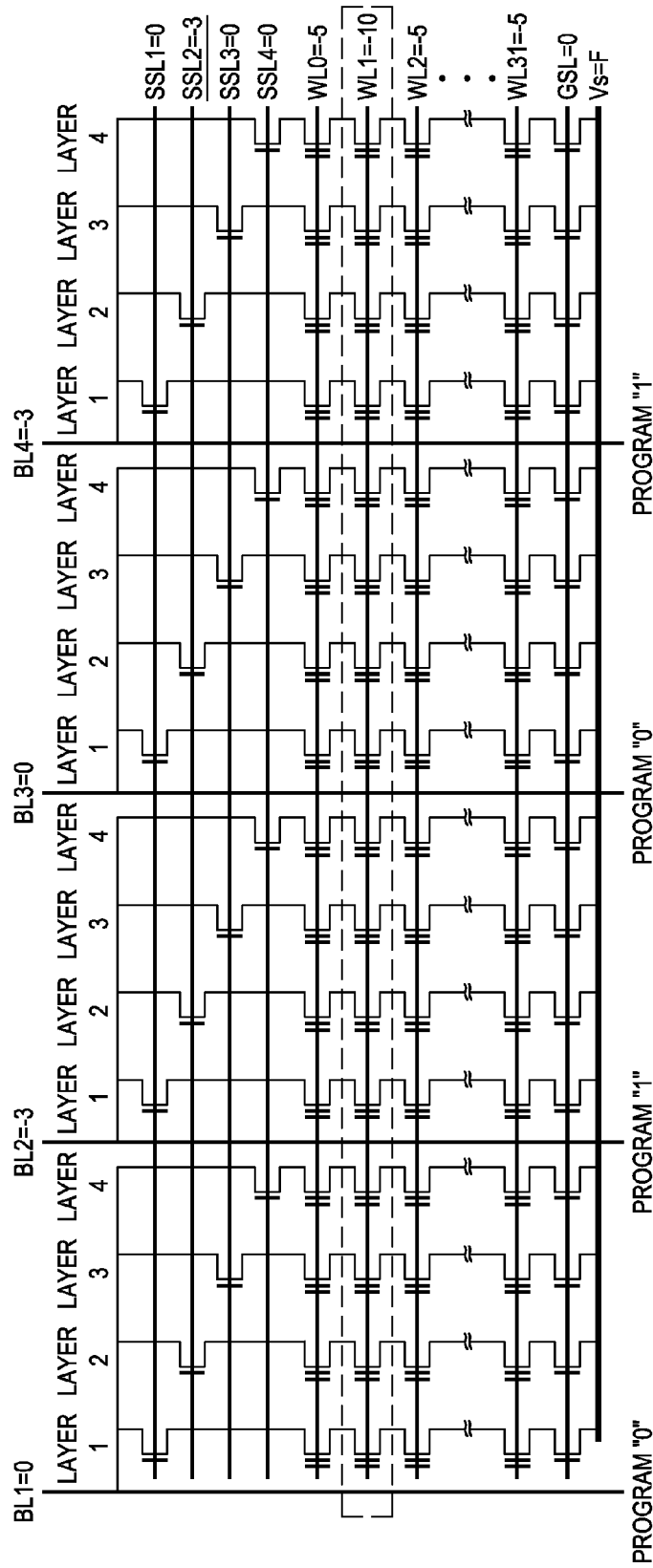
FIG. 13 illustrates the circuit diagram of FIG. 11 and depicts an exemplary PROGRAM operation.

FIG. 13 depicts, for the array of non volatile cells in FIG. 12, a program operation. In FIG. 13, the cells coupled to word line WL1 receive a potential of −10 volts on the gate electrode. For those cells in the layer 2, the SSL2 line provides a voltage of −3 volts. This potential will cause the select transistors coupled to the SSL2 line to couple the voltage at the bit lines BL to the active cells (Layer 2, cell coupled to word line WL1). The remaining SSL transistors receive a potential of 0 Volts on their gate electrodes, so that the remaining layers are not coupled to the bit lines BL. The ground select control line GSL is also at a potential of 0 Volts so that the voltage Vs is a "don't care" labeled F, since the potential Vs is not coupled to a cell. The remaining word lines WL are placed at a potential of −5 Volts, this potential is greater than the threshold potential for the remaining non volatile cells and they operate as "pass through" transistors which ensures the potential for programming placed on the respective bit lines BL will be coupled to the active cells (coupled to the word lines WL1 in layer 2 for each bit line BL1, 2, 3, 4.)

The mechanism for programming is to place a "0" or a "1" in the active cells. However, since erasure is performed first and erasure is defined, for the p-channel example, as a "1", the cells that are changed in state are only those in the portions labeled 'program "0"' in the FIG. 13, that is for the cells coupled to bit lines 1, and 3, these cells will be erased, while the active cells coupled to bit lines 2 and 4 will remain at a "1". This is accomplished by providing a different potential on bit lines 1, and 3, (0 volts for this p-channel example) than for the bit lines labeled 2, 4 (−3 volts in this example). For the cells being programmed to "0", holes are injected from the channel into the charge trapping layer, thereby changing the threshold potential and the logical value of the cell from the erased state of "1" to the programmed state of "0."

Figure 14:
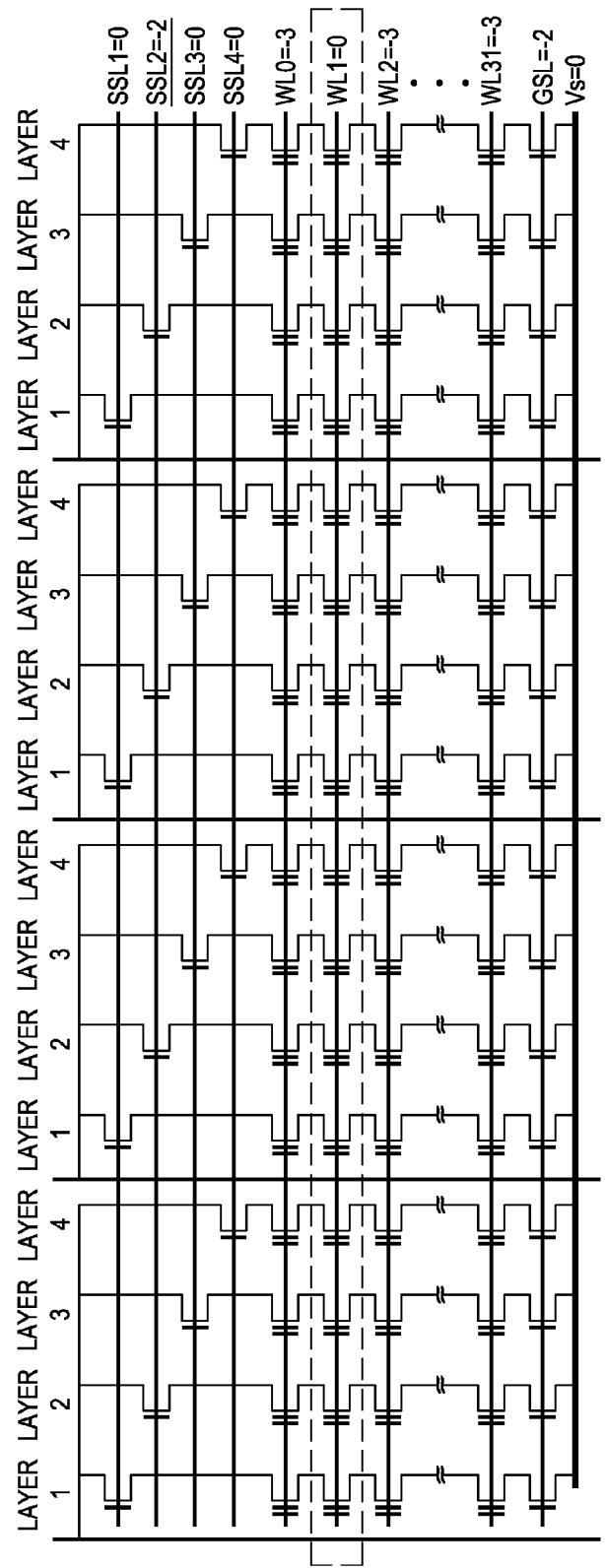
FIG. 14 illustrates the circuit diagram of FIG. 11 and depicts an exemplary READ operation.

FIG. 14 depicts the array portion of FIGS. 11, 12, and 13 for a READ operation. In FIG. 14, the source select line SSL2 is again programmed with a potential to select the second memory layer for each bit line BL1, 2, 3, 4. Again the word lines WL0 and WL2-31 are programmed to the cells coupled on those rows all act as "pass through" or "pass gate" transistors by providing a potential greater than their threshold voltages, e.g. −3 Volts, to each gate electrode for each memory cell. The potential on word line WL1 is 0 volts, as indicated in FIG. 6C, for the read operation. The ground select line GSL is set to a potential of −2 Volts, so that it acts as a pass gate to couple the potential Vs to the selected transistor, Vs=0 being coupled to the source terminal as shown in FIG. 6A. The bit line voltages BL are programmed to a −1 potential, this potential ends up ate the drain terminal for the active transistors as indicated in the table of FIG. 6C.

In operation, the mechanism of reading the active cells, for each of the four memory cells coupled to the respective bit lines BL1, 2, 3, 4, each active cell located on the corresponding memory layer, Layer 2 for each bit line BL and each coupled to word line WL1, is hole current Ih. If the active memory cell is a programmed cell with a higher threshold voltage, this current does not flow and "0" will be read. If the active memory cell is an erased cell with a lower threshold voltage, the current flows and "1" will be read.

The memory cells shown in FIGS. 13-14 serve as pass transistors in program (FIG. 13) and read (FIG. 14) all have a WL potential higher than threshold voltage since the cells have to pass and transfer the BL voltages. The WL potential in program node is higher (~−5V) since the pass transistors have to transfer a higher BL voltage (−3V). The WL potential in program is lower (~−3V) since the pass transistors have to transfer a lower BL voltage (−1V). During a read operation, the erased cell ("1" state) stores electrons with a lower threshold voltage and thus, hole current flows. The programmed cell ("0" state) stores holes with a higher threshold voltage and thus, hole current does not flow. Note again that "erase" and "program" may be interchanged, as is known in the art.

Figure 15:
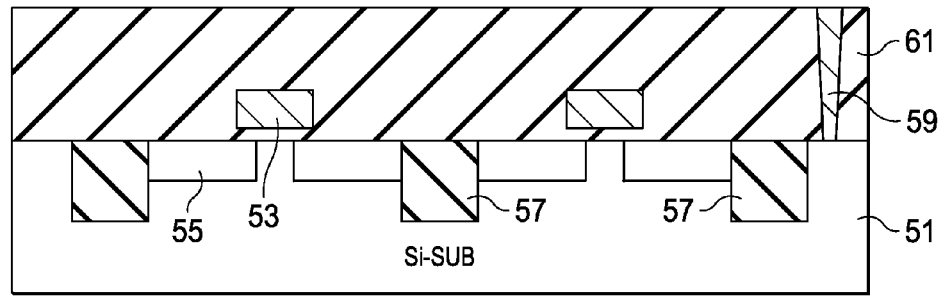
FIG. 15 depicts an intermediate process step in forming the three dimensional array of FIG. 10.

FIG. 15 depicts the first several steps in the process of forming the three dimensional memory array of FIG. 10. In FIG. 15, a semiconductor substrate 51 is provided. Preferably this could be a 100 oriented silicon substrate. Conventional semiconductor process steps are then performed to form the isolation trenches 57, source and drain regions 55, gate electrodes 53. For example, a pad oxide layer may be grown on a clean substrate, an oxidation resistant layer such as a nitride may be provided, openings may be made by pattern and etch in the nitride and oxide, trenches may be etched into the substrate using an anisotropic etch. An oxide may be deposited within the trenches, the nitride acting as an oxidation resistant layer to prevent oxide from forming outside the trenches, or the oxide may be over-deposited and etched back. The nitride can then be removed and self aligned gate dielectric, gate electrode, patterning of the electrode, doping of the source and drain regions by ion implant and/or thermal diffusion, and other conventional steps such as sidewall formation and salicidation may be performed to form high voltage CMOS devices as is known in the art.

Next, the interlevel dielectric 61 is formed over the substrate, and if preferred a variety of dielectric materials may be used in a stack arrangement. Vias 59 are formed to couple the (yet to be formed) memory layers down to the substrate and/or the high voltage MOS devices.

Figure 16:
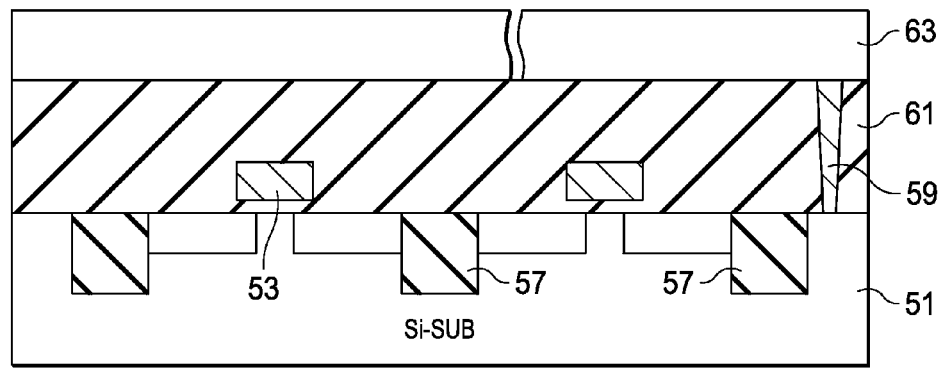
FIG. 16 depicts the array of FIG. 15 after additional processing steps are completed.

FIG. 16 depicts steps continuing in the formation of the three dimensional array of FIG. 10, following another intermediate step after the structure in FIG. 15 is complete. In FIG. 16 an epitaxial silicon layer or polysilicon layer 63 is deposited and preferably doped "in situ" to form the uniformly doped channel regions for the SONOS cells.

Figure 17:
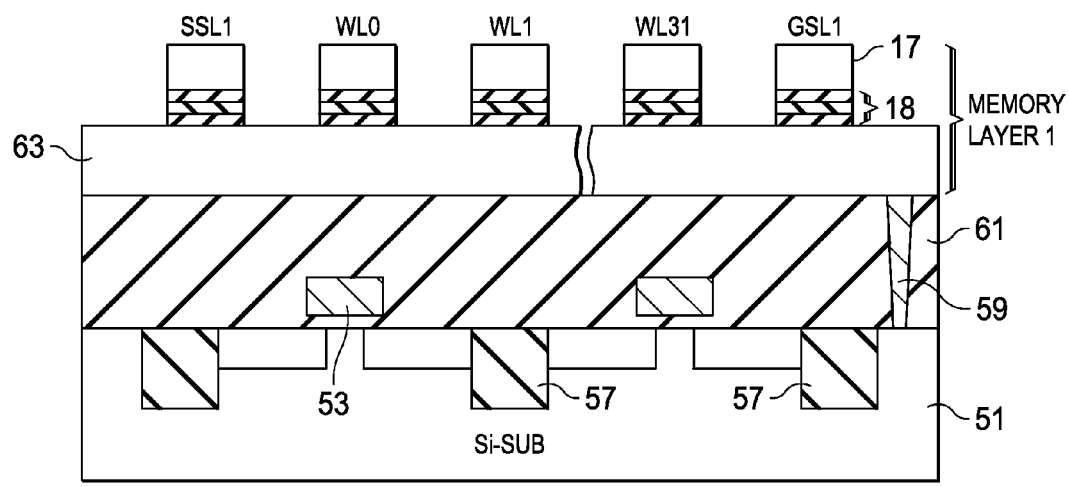
FIG. 17 depicts the array of FIG. 6 after further processing steps are completed.

FIG. 17 then illustrates the three dimensional array in another intermediate stage after additional steps are completed on the structure of FIG. 16. After the polysilicon or epitaxial silicon 63 is formed to form the uniformly doped channel region, a charge trapping dielectric layer is formed, preferably by depositing an oxide layer, a nitride layer, and optionally a top oxide layer to form an ONO dielectric 18, then gate electrodes 17 are formed of polysilicon or other gate materials and again self aligned photolithographic pattern and etch steps are used to complete the SONOS structures as shown in FIG. 17.

The remaining steps to form a multiple layer vertical array such as the one illustrated in FIG. 10 are repeated performances of those steps already described. An interlevel dielectric is deposited for each memory layer, and another layer is started above it by first depositing or forming a polysilicon or epitaxial silicon layer that is uniformly doped, and again the charge trapping layer dielectric and the gate electrode material is deposited, patterned, and etched to complete the SONOS devices on that layer. The layers are coupled together by vias 59 formed in the interlevel dielectrics 61 and after the via formation, the next layer begins again.

Finally, as shown in FIG. 10, a metal bit line layer is deposited or formed over the top layer of interlevel dielectric material and contacting the tops of the vias to couple the bit line to the layers below it. In this manner a circuit as provided in the schematic of FIG. 11 is implemented. A single layer can be used, or as many layers as the process can support, typically the memory cells will be formed on the polysilicon or local interconnect layers, and the first level of metal will be used to form the bit line layer, in an ASIC or SOC process.

The invention thus provides an improved SONOS non volatile memory cell for use in integrated circuits that is based on a uniformly doped channel region. This uniformly doped channel region is very tolerant of subsequent process steps in forming a vertically integrated array and is therefore much more useful than the cells of the prior art. The cells may be implemented as FinFET or triple gate devices, or as FD-SOI planar devices. The cells are formed on a layer with the bit lines forming the bottom layer, the charge trapping dielectrics provided over the bit lines, and the word lines forming a top layer arranged in another direction so that a memory cell is provided at each intersection of a word line with a bit line. The cells may be formed as p-channel or n-channel devices. Many layers of cells may be formed and coupled together using conventional semiconductor processing steps in a series of steps. Because the SONOS devices do not rely on thermally diffused source and drain regions, the thermal budget for the subsequent process steps can be quite generous.

The novel SONOS cells and the three dimensional memory arrays disclosed overcome the fabrication and thermal processing limitations of the prior art, while improving the performance of the resulting array. The preferred embodiments include non volatile memory arrays implemented as embedded FLASH or stand alone FLASH integrated circuits. In a preferred embodiment, the SONOS cells are arranged as a NAND FLASH array with excellent device density.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A three dimensional array of non-volatile memory storage cells, comprising:
   a substrate; and
   a plurality of memory layers overlying the substrate, each of the memory layers comprising:
      at least one bit line formed from a uniformly doped silicon region having a plurality of spaced apart memory cell regions formed within it, each memory cell region comprising a source region, a drain region and a channel region between the source and drain regions;
      a select device region comprising a source region, a drain region and a channel region between the source and drain regions, the source, drain and channel regions being formed of the uniformly doped silicon region of the at least one bit line;
      a ground device region comprising a source region, a drain region and a channel region between the source and drain regions, the source, drain and channel regions being formed of the uniformly doped silicon region of the at least one bit line;
      charge trapping storage dielectrics formed over each of the memory cell regions, the select device region and the ground device region, and overlying the channel region of the respective memory device region, select device region and the ground device region;
      conductive gate electrodes formed overlying the charge trapping storage dielectric for each of the memory cell regions, the select device region and the ground device region; and
      a dielectric layer overlying the gate electrodes and separating the respective memory layers in a vertical direction.

2. The array of memory storage cells in claim 1, and further comprising:
   at least one MOS device formed in the substrate; and
   a contact extending from the first memory layer of the one or more memory layers through an insulating layer over the substrate.

3. The array of memory storage cells in claim 1, and further comprising:
   at least one via formed in an inter-level dielectric layer between two of the memory layers.

4. The array of memory storage cells in claim 1, wherein each of the bit lines forms a local bit line and the memory cell regions are coupled in series to form a NAND memory array within each of the memory layers.

5. The array of memory storage cells in claim 4, wherein each of the conductive gate electrodes overlying the memory cell regions is coupled to a word line and a memory storage cell is located at intersections of the word lines and the local bit lines.

6. The array of memory storage cells in claim 1, wherein each of the storage cells is a FinFET device.

7. The array of memory storage cells in claim 1, wherein each of the storage cells is a silicon oxide nitride oxide silicon (SONOS) cell.

8. The array of memory storage cells in claim 1, wherein the gate electrodes overlying each of the select device regions is coupled to a bit line select line.

9. The array of memory storage cells in claim 1, wherein the gate electrode overlying each of the ground device regions is coupled to a ground select line.

10. The array of memory storage cells in claim 1, wherein the uniformly doped silicon region further comprises a uniformly doped polysilicon region.

11. A three dimensional array of non-volatile memory storage cells, comprising:
    a substrate;
    a plurality of memory layers overlying the substrate, each memory layer comprising:
       a plurality of local bit lines each formed from a uniformly doped silicon region having a source select device region formed within it, a ground select device region formed within it, and a plurality of spaced apart memory cell regions formed within it and disposed between the source select device region and the ground select device region, each of the source select device region, the ground select device region and the memory cell regions comprising a source region, a drain region and a channel region between the source and drain regions;
       charge trapping storage dielectrics formed over each of the memory cell regions, the select device region and the ground device region, and overlying the channel region of the respective memory device region, select device region and the ground device region; conductive gate electrodes formed overlying the charge trapping storage dielectric for each of the memory cell regions, the select device region and the ground device region; and a dielectric layer overlying the gate electrodes and separating the respective memory layers in a vertical direction.

12. The array of memory storage cells of claim 11, wherein the source select device region, the ground select device region and the memory cell regions each comprise a finFET device formed at an intersection of a gate electrode and one of the local bit lines.

13. The array of memory storage cells of claim 11, and further comprising a vertical via extending through the dielectric layer between at least two of the memory layers.

14. The array of memory storage cells of claim 11, wherein the uniformly doped silicon region comprises a uniformly doped polysilicon region.

15. The array of memory storage cells of claim 11, wherein each of the memory storage cells comprises a FinFET device.

16. The array of memory storage cells of claim 11, wherein each of the memory storage cells comprises a silicon oxide nitride oxide silicon (SONOS) cell.

17. The array of memory storage cells in claim 11, wherein each local bit line and the corresponding memory cell regions are coupled in series to form a NAND memory array within each of the memory layers.

18. The array of memory storage cells in claim 11, and further comprising:
    at least one MOS device formed in the substrate; and
    a contact extending from the first memory layer of the one or more memory layers through an insulating layer over the substrate.

19. The array of memory storage cells in claim 11, and further comprising:
    at least one via formed in an inter-level dielectric layer between two of the memory layers.

* * * * *